US010834831B2

(12) United States Patent
Tuominen (10) Patent No.: US 10,834,831 B2
(45) Date of Patent: Nov. 10, 2020

(54) COMPONENT CARRIER WITH ALTERNATINGLY VERTICALLY STACKED LAYER STRUCTURES OF DIFFERENT ELECTRIC DENSITY

(71) Applicant: AT&S (China) Co. Ltd., Shanghai (CN)

(72) Inventor: Mikael Tuominen, Shanghai (CN)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 15/771,940

(22) PCT Filed: Oct. 29, 2016

(86) PCT No.: PCT/IB2016/056544
§ 371 (c)(1),
(2) Date: Apr. 27, 2018

(87) PCT Pub. No.: WO2017/072737
PCT Pub. Date: May 4, 2017

(65) Prior Publication Data
US 2018/0343751 A1   Nov. 29, 2018

(30) Foreign Application Priority Data

Oct. 30, 2015  (CN) .......................... 2015 1 0726722

(51) Int. Cl.
*H05K 3/46*   (2006.01)
*C09J 9/02*   (2006.01)
(Continued)

(52) U.S. Cl.
CPC .............. *H05K 3/4694* (2013.01); *C09J 9/02* (2013.01); *H05K 1/0298* (2013.01); *H05K 1/142* (2013.01);
(Continued)

(58) Field of Classification Search
CPC .... H05K 3/4694; H05K 1/0298; H05K 1/142; H05K 1/144; H05K 1/187; C09J 9/02
(Continued)

(56) References Cited

U.S. PATENT DOCUMENTS 5,948,533 A * 9/1999 Gallagher .......... B23K 35/0222
174/255
8,177,577 B2   5/2012 Takahashi
(Continued)

FOREIGN PATENT DOCUMENTS

CN   1405868 A   3/2003
CN   1520448 A   8/2004
(Continued)

OTHER PUBLICATIONS

Abstract of corresponding document: WO03000816 (A1).
(Continued)

*Primary Examiner* — Tremesha S Willis
(74) *Attorney, Agent, or Firm* — Robert A. Blaha; Smith Tempel Blaha LLC (57) ABSTRACT

A component carrier includes a plurality of low density layer structures, and a plurality of high density layer structures having a higher density of electrically conductive structures than the plurality of low density layer structures, where the low density layer structures and the high density layer structures are alternatingly vertically stacked.

20 Claims, 6 Drawing Sheets

(51) Int. Cl.
*H05K 1/02* (2006.01)
*H05K 1/14* (2006.01)
*H05K 1/18* (2006.01)
*H05K 3/32* (2006.01)

(52) U.S. Cl.
CPC ............ *H05K 1/144* (2013.01); *H05K 1/187* (2013.01); *H05K 3/323* (2013.01); *H05K 3/4623* (2013.01); *H05K 3/4697* (2013.01); *H05K 2201/09127* (2013.01); *H05K 2203/061* (2013.01)

(58) Field of Classification Search
USPC ........................................................ 174/255
See application file for complete search history.

(56) References Cited

U.S. PATENT DOCUMENTS 8,867,219 B2 * 10/2014 Weatherspoon ....... H05K 1/189
174/250
2013/0025925 A1 1/2013 Naganuma et al.
2014/0144675 A1 5/2014 Hsu
2014/0175672 A1 6/2014 Choi
2015/0250050 A1 9/2015 Lee

FOREIGN PATENT DOCUMENTS

| | | | |
|---|---|---|---|
| CN | 101610635 | A | 12/2009 |
| CN | 203151864 | U | 8/2013 |
| CN | 103458605 | A | 12/2013 |
| CN | 203482494 | U | 3/2014 |
| CN | 104051395 | A | 9/2014 |
| CN | 104244582 | A | 12/2014 |
| CN | 104883807 | A | 9/2015 |
| CN | 104952838 | A | 9/2015 |
| DE | 10 202 136 | A1 | 7/2003 |

OTHER PUBLICATIONS

The State Intellectual Property Office of the PRC; Second Office Action in Application 201510726722.X; dated Apr. 9, 2019; pp. 1-11.

Extended European Search Report issued in EPO Patent Application 16 859 186.5, dated Oct. 21, 2019; pp. 1-8; European Patent Office, 80298, Munich, Germany.

* cited by examiner

COMPONENT CARRIER WITH ALTERNATINGLY VERTICALLY STACKED LAYER STRUCTURES OF DIFFERENT ELECTRIC DENSITY

TECHNICAL FIELD

The invention relates to a component carrier and a method of manufacturing a component carrier.

TECHNOLOGICAL BACKGROUND

Conventionally, a carrier for carrying electronic components comprises a multilayer structure. Multilayer carriers with board-in-board technology are provided to meet the demand for higher fan-out and less available space in the device. The manufacturing of such carriers in one manufacturing unit is conventionally associated with high costs and difficult accuracy and reliability of the connections between the regions with a high number of electronic links and connections and the regions with a low number of electronic links and connections.

SUMMARY

There may be a need to enable a low cost design of component carriers with very simple design rules and at the same time having a high fan-out performance and being reliable during operation.

A component carrier and a method of manufacturing a component carrier according to the independent claims are provided.

According to an exemplary embodiment of the invention, a component carrier is provided, wherein the component carrier comprises a plurality of low density layer structures, a plurality of high density layer structures which has a higher density of electrically conductive structures than the plurality of low density layer structures, wherein the low density layer structures and the high density layer structures are alternatingly vertically stacked.

According to another exemplary embodiment of the invention, a method of manufacturing a component carrier is provided, wherein the method comprises providing a plurality of low density layer structures, providing a plurality of high density layer structures having a higher density of electrically conductive structures than the plurality of low density layer structures, and alternatingly vertically stacking the low density layer structures and the high density layer structures.

Overview of Embodiments

In the context of the present application, the term "component carrier" may particularly denote any support structure which is capable of accommodating one or more electronic components thereon and/or therein for providing both mechanical support and electrical connectivity.

In the context of the present application, the term "electrically conductive structure" may particularly denote a physical structure being able of conducting electrical current. In particular, the electrically conductive structure may be capable of conducting signals. Furthermore, the electrically conductive structure may be a continuous or patterned layer, or a vertical interconnect structure such as a via, or a pad.

In the context of the present application, the term "density of electrically conductive structures" may particularly denote a number of electrically conductive elements or sub-structures per unit of volume. It may also be possible to integrate electrically conductive elements of different sizes. Thus, a higher number of smaller electrically conductive elements may result in a higher density of electrically conductive structures than a lower number of larger electrically conductive structures or elements. The density of electrically conductive structures may further be influenced by a thickness of the electrically conductive element and/or a size of an annular ring of a pad or a via which may form part of the electrically conductive structures. Furthermore, the density of the electrically conductive structures may be influenced or defined by a diameter of a via or a line-to-line distance.

In the context of the present application, the term "low density layer structure" may particularly denote a structure which may have a smaller number of electrically conductive elements or sub-structures per unit of volume than a high density layer structure. The low density layer structure may also denote a structure which may comprise relatively big electrically conductive elements such that a low number of such electrically conductive elements may be integrated in one unit of volume.

In the context of the present application, the term "high density layer structure" may particularly denote a structure which may have a larger number of electrically conductive elements per unit of volume than a low density layer structure. The high density layer structure may also denote a structure which may comprise relatively small electrically conductive elements such that a high number of such electrically conductive elements or sub-structures may be integrated in one unit of volume.

In the context of the present application, the term "alternatingly vertically stacked" may particularly denote that at least one high density layer structure may be vertically arranged in-between two low density layer structures, and at least one low density layer structure may be vertically arranged in-between two high density layer structures. As a matter of course, alternatingly vertically stacked may also denote that one low density layer structure may be arranged in-between two high density layer structures. Vertically stacked also denotes that a large part of one of the two main surfaces of the low density layer structure overlaps a large part of one of the two main surfaces of the high density layer structure. The large part of one of the two main surfaces may in particular be more than 90% of the one main surface, further in particular more than 95% of the one main surface. The overlap may be even significantly below the given figures. More particularly, the term "alternatingly vertically stacked" may denote a stack comprising at least one "low density-high density-low density-high density" sequence.

According to an exemplary embodiment of the invention, a component carrier may comprise an area of low density layer structures each comprising low density layer sub-structures or elements, for the most part of the component carrier with very simple design rules. High density layer structures each comprising high density layer sub-structures or elements, may be used in the areas of the component carrier where electronic components are connected to the component carrier being electronic components having a high fan-out of signals. Thus, the areas of high density layer sub-structures may be located selectively in the areas of the component carrier where they are really needed for connection to the carried electronic components. In areas where there are no electronic components connected to the component carrier only low density layer sub-structures are provided. A module made of the low density layer structure comprising the low density layer sub-structures, may be manufactured separately from a module made of the high density layer structure comprising the high density layer sub-structures. In a separate manufacturing process the component carrier may be assembled by bringing together the module made of the high density layer structure with the module being made of the low density layer structure. An alternatingly vertically stacking of the plurality of low density layer structures with the plurality of the high density layer structures may have the advantage that a high fan-out is achievable and at the same time the component carrier may be manufactured at low costs. Additionally, the plurality of low density layer structures is less prone to errors and has better cooling characteristics than the plurality of high density layer structures due to the low number of electrically conductive elements. Simultaneously, flatness of the component carrier can be guaranteed in a better way, and thickness control of the component carrier can be simplified (which is particularly advantageous for back-end processing).

By taking the above-mentioned measures, a better stability of the overall construction of the component carrier may be achieved, because a lot of the effort for fan-out can be handled in the high density layer structures without excessive increase in thickness of the component carrier. For instance in the scenario of a large ball grid array (BGA) with many contacts, only the provision of high density layer structures would be advantageous but would cause height problems. The provision of the low density layer structures may compensate this, so that the whole system remains balanced and a flat surface may be obtained.

In the following, further exemplary embodiments of the component carrier and the method of manufacturing the component carrier will be explained.

In an embodiment, the differing density of electrically conductive structures may be one or more of the following:

a number of electrically conductive sub-structures or elements per unit of volume, which number may be lower for a respective low density layer structure as compared to a respective high density layer structure; and/or a complexity of constitution of the respective low density layer structure or high density layer structure, which complexity may be lower for a respective low density layer structure as compared to a respective high density layer structure, and/or a number of stacked layer sub-structures or elements of which the respective one of the plurality of low density layer structures or plurality of high density layer structures is constituted, and which number may be lower for a respective low density layer structure as compared to a respective high density layer structure, and/or a thickness of a respective of layer sub-structures of which the respective low density layer structure or high density layer structure is constituted, and which thickness may be larger for a respective low density layer structure as compared to a respective high density layer structure, and/or one or more materials of layer sub-structures of which the respective low density layer structure or high density layer structure is constituted, and/or a high frequency suitability (which may be present for a high density layer structure) or a lacking high frequency suitability (which may be present for a low density layer structure) of the respective low density layer structure or high density layer structure, and/or an integration density defined as a number of sub-structures per volume of the respective low density layer structure or high density layer structure, which may be lower for a respective low density layer structure as compared to a respective high density layer structure.

With regard to the terminology, a layer structure (such as a multiple layer module or laminate, or a processed layer having multiple inlays therein) may be composed of multiple layer sub-structures or elements (such as a continuous or patterned layer, or a layout inlay such as a via).

The different complexity of construction of the different low density layer structures or high density layer structures may correspond to a different integration density of electrically conductive features and/or electrically insulating features of the respective low density layer structure or high density layer structure. For instance, the number of vias per volume of the respective low density layer structure or high density layer structure may be a measure for this. A combination of high density layer structures and low density layer structures in one component carrier may become possible.

When the number of layer sub-structures (in particular electrically conductive layer sub-structures and/or electrically insulating layer sub-structures) differ for the different low density layer structures or high density layer structures, in particular when a standard layer thickness is identical for the different low density layer elements and high density layer elements, a component carrier with a higher number of layer sub-structures in a high density layer structure and with a lower number of layer sub-structures in the low density layer structure (in particular combining to different entire thicknesses) may be freely combined.

A basic (or standard) thickness of a basic layer element or sub-structure, multiple of which being used for forming a lamination type component carrier, may vary for the different low density layer structures or high density layer structures. This may have an impact on the function of the respective low density layer structure or high density layer structure. Additionally, a combination of low density layer sub-structures and high density layer sub-structures with different thicknesses may be provided.

Even different material combinations of the different low density layer structures and high density layer structures can be freely combined in a common component carrier.

For example, a first material suitable for the low density layer structures may be combined with a second material suitable for the high density layer structures.

In an embodiment, at least one of the plurality of low density layer structures comprises a cavity, wherein at least one of the plurality of high density layer structures is arranged in the cavity. The cavity in the at least one of the plurality of low density layer structures may be provided as a blind hole or as an opening in the at least one low density layer structure. The opening may extend through one or more low density layer sub-structures or even through the whole low density layer structure. When an opening or through-hole is provided in one of the low density layer sub-structures of the low density layer structure, at least one other low density layer sub-structure may be provided which may form the bottom of the cavity in relation to the at least one of the low density layer sub-structures comprising the opening. The at least one high density layer structure may be positioned in the cavity provided in the at least one low density layer structure. The shape and dimension of the plurality of high density layer structures positioned in the cavity may correspond to the shape and dimension of the cavity such that the cavity may be fully filled up with the high density layer structure. It is also possible that the cavity is not completely, but only partly filled with the high density layer structure such that it is possible to accommodate one or more additional high density layer sub-structure(s) or even one or more high density layer structure(s) in the cavity.

In an embodiment, at least one of the plurality of low density layer structures comprises a cavity, wherein at least two of the plurality of high density layer structures are arranged in the cavity, and wherein at least one of the plurality of low density layer structures is vertically interposed or sandwiched between the at least two of the plurality of high density layer structures. It may be possible to provide the plurality of high density layer structures as very thin layer structures. Thus, the difference between the thickness of the low density layer structures and the thickness of the high density layer structures may be compensable by interposing a low density layer structure between two high density layer structures. Furthermore, the cavity may be deeper than one high density layer structure being positioned in the cavity. Thus, by interposing one of the plurality of low density layer structures between two of the plurality of high density layer structures, the cavity may not need to be filled up with a high number of thin high density layer structures being cost intensive. Additionally, an even thickness of the component carrier may be ensured by interposing low density layer structures in-between the high density layer structures such that the filled cavity may have an even surface and may hence be in flush with the rest of the component carrier. A low density layer structure in-between the high density layer structures in the cavity may also enable a more even or homogeneous heat conductivity than the high density layer structure due to a lower density of electrically conductive structures in the low density layer structure.

In an embodiment, an adhesive structure is provided on the surface of the cavity. In the context of the present application, the term "adhesive structure" may particularly denote an adhesive layer (or body of another shape) being applicable on either one of the high density layer structure or the low density layer structure. Furthermore, the adhesive structure may be applicable on one or all of the surfaces of the cavity. The adhesive structure may in particular be made of a paste or a film. A preferred adhesive structure may be electrically conductive such that the adhesive structure is able to conduct an electric current, power or a signal between two elements being fixed together by the adhesive structure.

The adhesive structure may be formed on the surface of the cavity as a layer having a relatively thin thickness compared to the thickness of the plurality of high density layer structures which are fixed to the surface of the cavity by the adhesive structure. Providing an adhesive structure on a surface of the cavity may have the advantage that a first high density layer structure inserted into the cavity, has a fixed position when another high density layer structure or a low density layer structure is fixed on top of the first high density layer structure for the purpose of filling up the cavity.

In an embodiment, an adhesive structure, for instance of the above-mentioned type, is provided in-between a low density layer structure and a high density layer structure. By providing an adhesive structure in-between the low density layer structure and the high density layer structure, the positioning of the low density layer structure relatively to the high density layer structure may ensure that the high density layer structure and the low density layer structure are prevented from moving relatively to each other. Thus, providing a further high density layer structure or a further low density layer structure is facilitated if the respective layer structure being already positioned inside the cavity is already immobilized in the cavity.

In an embodiment, the adhesive structure comprises or consists of an at least partially electrically conductive adhesive. An electrically conductive adhesive may provide an electrical connection between the two layer structures which are fixed together by the adhesive structure without the need of additional contactation and providing for example electrical beads or balls inside the adhesive structure. Thus, the application of the adhesive structure may be easy, fast and reliable in terms of simultaneously providing mechanical connection and electrical coupling.

In an embodiment, the adhesive structure comprises at least one of the group consisting of an Anisotropic Conductive Film (ACF) and an Anisotropic Conductive Paste (ACP). An ACF is an adhesive interconnection system in the shape of a film that is used to establish electrical and mechanical connections. ACF can be used alternatively in a paste form referred to as ACP. Although an Anisotropic Conductive Film is usually preferred, other adhesives may be used as well. The Anisotropic Conductive Film may be a partially conductive adhesive comprising particles consisting of copper. The connection between a low density layer structure having relatively large electrical terminals and a high density layer structure having relatively small electrical terminals may be difficult. The particles of copper in the Anisotropic Conductive Film allow the connection between very small connection terminals in the first of the two elements being adhered together and the larger connection terminals in the second of the two elements being fixed together.

In an embodiment, at least one of the group consisting of or comprising the plurality of high density layer structures and the plurality of low density layer structures comprises or consists of a stack of at least one electrically insulating layer sub-structure or element and at least one electrically conductive layer sub-structure or element. For example, the component carrier may be a laminate of the mentioned electrically insulating layer sub-structure(s) and electrically conductive layer sub-structure(s), in particular formed by applying mechanical pressure, if desired supported by thermal energy. The mentioned stack may provide a plate-shaped plurality of low density layer structures and a plurality of high density layer structures capable of providing a large mounting surface for one or more electronic components being mountable to the stack and being nevertheless very thin and compact. The term "layer sub-structure" may particularly denote a continuous layer, a patterned layer or a plurality of non-consecutive islands within a common plane.

In an embodiment, the at least one electrically insulating layer sub-structure or element comprises at least one of the group consisting of resin, in particular Bismaleimide-Triazine resin, cyanate ester, glass, in particular glass fibers prepreg material, polyamide, liquid crystal polymer, epoxy-based Build-Up film, FR4 material, FR5 material, a ceramic, and a metal oxide. Although prepreg or FR4 and/or FR5 are usually preferred, other materials may be used as well.

In an embodiment, the at least one electrically conductive layer sub-structure or element comprises at least one of the group consisting of copper, aluminum, and nickel. Although copper is usually preferred, other materials are possible as well.

In an embodiment, the component carrier is shaped as a flat plate. This contributes to the compact design of the component carrier, wherein the component carrier nevertheless provides a large basis for mounting one or more electronic components thereon. Furthermore, even a very thin embedded electronic component can be conveniently embedded, thanks to its small thickness, into a thin plate such as for example a printed circuit board.

In an embodiment, the component carrier is configured as one of the group consisting of a printed circuit board, and a substrate.

In the context of the present application, the term "printed circuit board" (PCB) may particularly denote a plate-shaped component carrier which is formed by laminating several electrically conductive layer elements or sub-structures with several electrically insulating layer elements or sub-structures, for instance by applying pressure, if desired accompanied by the supply of thermal energy. As preferred materials for PCB technology, electrically conductive layer elements or sub-structures are made of copper, whereas the electrically insulating layer elements or sub-structures may comprise resin and/or glass fibers, so-called prepreg or FR4 material. The various electrically conductive layer elements or sub-structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "substrate" may particularly denote a small component carrier having substantially the same size as an electronic component to be mounted thereon.

In an embodiment, the component carrier is a laminate-type component carrier. In such an embodiment, the component carrier is a compound of multiple layer elements or sub-structures which are stacked and connected together by applying a pressing force, if desired accompanied by heat.

In an embodiment, the component carrier further comprises a first main surface configured (for instance being equipped with respective pads positioned and dimensioned in accordance with corresponding requirements) for mounting a component, and a second main surface opposing the first main surface, wherein the first main surface is part of one of the plurality of high density layer structures. Additionally or alternatively, the second main surface may be part of one of the plurality of low density layer structures. The first main surface and the second main surface may denote the two surfaces of the component carrier which have substantially the same spatial surface area, being considerably larger than the other four edge-type surfaces of the component carrier. The first main surface opposes the second main surface and is at least substantially parallel to the second main surface. The first main surface may provide a high fan-out of signals out of the component carrier and an electronic component needing a high fan-out of signals to be driven appropriately, may be connected to the first main surface. On the second main surface, another electronic component may be connected.

In an embodiment, the component carrier further comprises one or more embedded electronic components. The embedded electronic component(s) may be positioned on or in one of the plurality of low density layer structures, in particular in a cavity inside one of the plurality of low density layer structures. Alternatively, the embedded electronic component may be positioned on or in one of the plurality of high density layer structures. The embedded electronic component may require a high fan-out of signals which may possibly be routed out of the component carrier via a combination of at least one low density layer structure and at least one high density layer structure.

In an embodiment, for instance, the embedded electronic component is selected from a group consisting of or comprising an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. However, other embedded electronic components may be also embedded in the component carrier.

In an embodiment, the plurality of high density layer structures and the plurality of low density layer structures are configured so that electrically conductive sub-structures, in particular comprising high density vias, of different high-density structures are electrically coupled to one another via electrically conductive sub-structures, in particular comprising low density vias, of at least one of the low density layer structures. The low density vias may have a larger dimension and a smaller number than the high density vias. Thus, electric signals (and, additionally or alternatively, thermal energy generated during operation of the component carrier) can be guided out of the interior of the component carrier in an improved way. Hence, fan-out of the signals can be simplified. In particular, the signal path along which the signals have to propagate in a vertical direction for being transmitted between an exterior and an interior of the component carrier is very small.

In an embodiment, at least one of the high density layer structures is configured as a substrate and at least one of the low density layer structures is configured as a printed circuit board, in particular so that the substrate is built in the printed circuit board. Thus, a substrate-in-PCB board can be formed.

In an embodiment, the plurality of high density layer structures are electrically connected with one another directly via the plurality of low density layer structures. By taking this measure, the component carrier becomes more stable, and a more sophisticated and complicated fan-out is possible.

In an embodiment, it is also possible that, in addition to the alternating vertical stack of high density layer structures and low density layer structures, the component carrier also comprises one or more portions being formed of multiple high density layer structures only and/or being formed of multiple low-density layer structures only. Furthermore, it is also possible that, in at least a portion of the component carrier, the high density layer structures and the low-density layer structures are not only stacked vertically, but are also juxtaposed next to one another in a horizontal direction or in a horizontal plane (perpendicular to a vertical axis of the component carrier).

In an embodiment, at least a part of the plurality of low density layer structures is a readily manufactured module being readily manufactured (in particular being readily laminated) prior to the stacking. The manufacturing of the plurality of low density layer structures may take place at another manufacturing side than the assembly of the plurality of low density layer structures with the plurality of high density layer structures. It may also be possible to pre-manufacture (in particular to pre-laminate) at least part of the low density layer structures as semi-manufactured modules, for example by manufacturing single high density layer structures, which are then readily manufactured at the same assembly place where the plurality of low density layer structures are assembled with the plurality of high density layer structures. Providing the low density layer structures as entirely manufactured modules may provide the benefit that the manufacturing of the plurality of low density layer structures and the assembly of the low density modules with the high density modules may be harmonized or parallelized such that waiting times are shortened or even avoided.

In an embodiment, at least part of the plurality of high density layer structures is a readily manufactured module (in particular a readily pre-laminated module) being readily manufactured prior to the stacking. The manufacturing of the high density layer structures may take place at another manufacturing side than the assembly of the plurality of high density layer structures with the plurality of low density layer structures. It may also be possible to pre-manufacture the high density layer structures as semi-manufactured modules, for example by manufacturing single high density layer structures, which are then readily manufactured at the same assembly place where the plurality of high density layer structures are assembled with the plurality of high density layer structures. Providing the high density layer structures as entirely manufactured modules may provide the benefit that the manufacturing of the plurality of high density layer structures and the assembly of the high density modules with the low density modules may be harmonized or parallelized such that waiting times are shortened or even avoided.

BRIEF DESCRIPTION OF THE DRAWINGS

The aspects defined above and further aspects of the invention are apparent from the examples of embodiment to be described hereinafter and are explained with reference to these examples of embodiment.

DETAILED DESCRIPTION OF EXEMPLARY EMBODIMENTS

The illustrations in the drawings are schematically presented. In different drawings, similar or identical elements are provided with the same reference signs.

Before, referring to the drawings, exemplary embodiments will be de-scribed in further detail, some basic considerations will be summarized based on which exemplary embodiments of the invention have been developed.

According to an exemplary embodiment, a component carrier such as a PCB with local high density areas (i.e. a plurality of high density layer structures) but with other sections manufactured according to standard technology (i.e. a plurality of low density layer structures) is provided. This technique allows a user to choose low cost design for the main board with very simple design rules. The high and low density layer structures may be embodied as prefabricated modules which may be manufactured separately in very high utilization manner and may be separately placed on the main board. Manufacturing of such component carriers can be done by first manufacturing a standard PCB or other board containing two or more copper layers as a first low density layer structure. This may be followed by creating a cavity in a specific area of the PCB where the advanced design rules are needed. Furthermore, an anisotropic layer (for example a screen printed type or film type) may be placed inside of the cavity. Additionally, a highly advanced, high utilization high density integration board may be manufactured separately. This can be followed by placing a fan-out module (e.g. one or more high density layer structures) into the main PCB cavity. Then, a next layer may be connected by lamination to even out the surface, producing the outer layer phase and creating a new cavity. Furthermore, the method may comprise placing an anisotropic layer (e.g. an adhesive structure) inside the cavity, and an additional fan-out module may be placed on the main PCB. The number of layers for each module PCB may be at least two and the number of modules may also be at least two. All of the modules may be systematically connected and together as a system may be able to provide highly advanced fan-out capabilities. An additional addition of electric layers (e.g. forming part of or constituting the plurality of low density layer structures) between the fan-out modules (e.g. forming part of or constituting the plurality of high density layer structures) may improve significantly the manufacturability and may ensure an even surface while reducing undesired variations of a board thickness.

Traditionally, single modules with board-in-board technology were used. Using a component carrier according to an exemplary embodiment of the invention presents a more advanced system based approach which may significantly improve the capabilities for fan-out purpose while at the same time maintaining a high manufacturability. Furthermore, such an architecture may avoid problems caused by board thickness variations. Such a component carrier allows a systematic sequential approach that ensures higher capabilities. A particular advantage is that a component carrier according to an exemplary embodiment can be manufactured with less effort compared to an advanced full PCB. Furthermore, the component carrier according to an exemplary embodiment of the invention provides better reliability, suppresses warpage, reduces mechanical stress risks (half embedded into the PCB) and reduces final assembly height compared to conventional PCB architecture with interposer modules. Additionally, a component carrier according to an exemplary embodiment of the present invention allows greater possibilities and succeeds to maintain high manufacturability and to avoid problems caused by the board thickness variation between the different boards compared to a conventional board-in-board design. A component carrier according to an exemplary embodiment of the present invention allows a highly advanced system of placing sequential fan-out modules (e.g. plurality of high density layer structures) that together help to achieve a fan-out of high pin count and narrow pitch components. A stepwise system of placing board-in-board modules (e.g. plurality of high density layer structures) on the simpler PCB (e.g. plurality of low density layer structures) may control the board thickness differences and may ensure high manufacturability and high yield in the production. Additionally, a systematic stepwise approach ensures a fan-out possibility of high pin count components.

According to an exemplary embodiment of the invention, a method of manufacturing a component carrier comprises manufacturing an interlayer core package (e.g. plurality of low density layer structures) with a cavity, laminating an ACF film (e.g. adhesive structure) into the cavity and producing a separate highly advanced module board (e.g. plurality of high density layer structures). Afterwards, the method comprises placing the fan-out board-in-board module (e.g. plurality of high density layer structures) into the cavity and laminating the next layer to even out the surface. Further, the method may comprise producing the outer layer phase with a new cavity and placing the ACF film and the additional module of the fan-out module system on the board. An amount of modules may be increased based on the demand.

Figure 1:
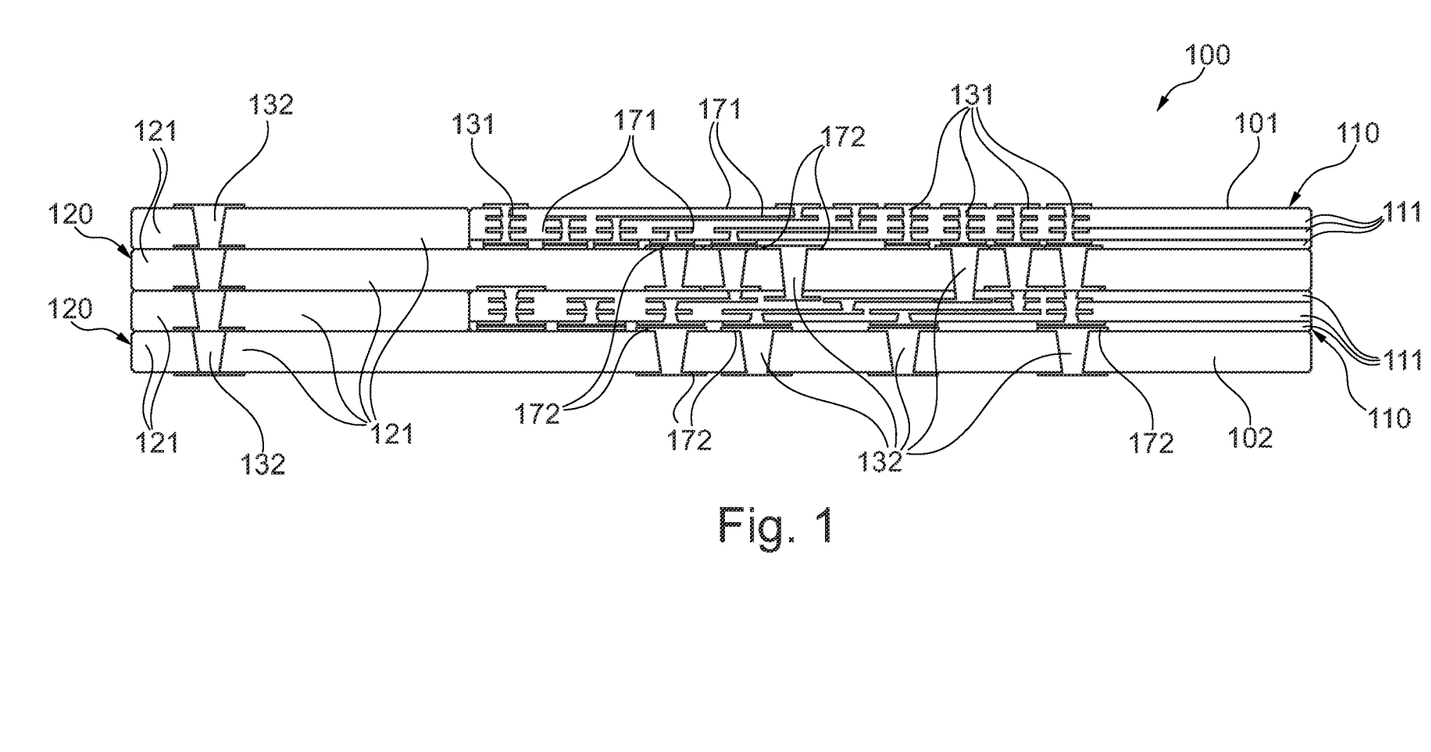
FIG. 1 shows a cross-sectional view of a component carrier obtained by carrying out a method of manufacturing a component carrier according to an exemplary embodiment of the invention.

In FIG. 1, a component carrier 100 according to an exemplary embodiment is shown. The component carrier 100 comprises two low density layer structures 120 each comprising two assigned low density layer sub-structures or elements 121. Furthermore, the component carrier 100 comprises two high density layer structures 110 each comprising three assigned high density layer sub-structures or elements 111, having a higher density of electrically conductive structures 131, 171 than a lower density of electrically conductive structures 132, 172 of the low density layer structures 120. The two low density layer structures 120 and the two high density layer structures 110 are alternatingly vertically stacked. A top surface of the component carrier 100 defines a first main surface 101. The bottom layer of the component carrier 100 which defines a lower or second main surface 102 of the component carrier 100, is one of the first low density layer structures 120. A first one of the high density layer structures 110, a second one of the low density layer structures 120 and a second one of the high density layer structures 110 are alternatingly vertically stacked on top of the first one of the low density layer structures 120 in a portion of the component carrier 100 on the right-hand side according to FIG. 1. In contrast to this, the low density layer structures 120 are stacked, without high density layer structures 110 in between, on the left-hand side according to FIG. 1.

The plurality of the high density layer structures 110 has a higher complexity of constitution than the plurality of the low density layer structures 120. The higher complexity is due to a higher number of stacked high density layer sub-structures or elements 111 and thus, due to a lower thickness of the individual high density layer sub-structures or elements 111. Additionally, the high density layer structures 110 comprise a higher number of electrically conductive structures, embodied as vias 131 or conductive paths 171, per volume as the number of electrically conductive structures, embodied as further vias 132 or further conductive paths 172 in the low density layer structures 120. The plurality of high density layer structures 110 and/or the plurality of low density layer structures 120 comprise(s) or consist(s) of a stack of electrically insulating layer sub-structures or elements (see reference numerals 111, 121) and electrically conductive layer sub-structures or elements (see reference numerals 131, 171, 132, 172). The electrically conductive layer sub-structures or elements may comprise the vias 131 and the further vias 132 such as the conductive paths 171 and the further conductive paths 172. The conductive paths 171 and the further conductive paths 172 may provide a horizontal connection between different terminals in one high density layer structure 110 or in one low density layer structure 120, for example between different terminals being distributed in one of the high density layer sub-structures 111 or in one of the low density layer sub-structures 121. The horizontal connection may be the connection being parallel to the two main surfaces 101, 102 of the component carrier 100. The conductive paths 171 and the further conductive paths 172 may be manufactured by patterning full layers (such as foils, for instance made of copper) using mask technologies. The vias 131 and the further vias 132 may be manufactured by forming the recesses (for instance by laser drilling or mechanically drilling) followed by electroplating and/or electro-less plating (e.g. galvanic plating) using mask technologies. Furthermore, a vertical electric connection between the different low density layer sub-structures 121 and the different high density layer sub-structures 111, respectively, runs vertically relating to the first main surface 101 or the second main surface 102 and is provided by the vias 131 in the high density layer structures 110 and the further vias 132 in the low density layer structures 120. The vias 131 and the further vias 132 are positioned in such a way that even a vertical connection between the low density layer structures 120 and the high density layer structures 110 is providable. This ensures short propagation paths. The vias 131 and the further vias 132, respectively, are provided by laser drilling or mechanically drilling and successive filling the manufactured hole with an electrically conductive material as for example copper.

The PCB type component carrier 100 is shaped as a plate. The first main surface 101 is configured for mounting an electronic component (such as an encapsulated electronic chip). The first main surface 101 is defined partially by one of the high density layer structures 110 and partially by one of the low density layer structures 120. The second main surface 102 is defined exclusively by one of the low density layer structures 120.

Figure 2:
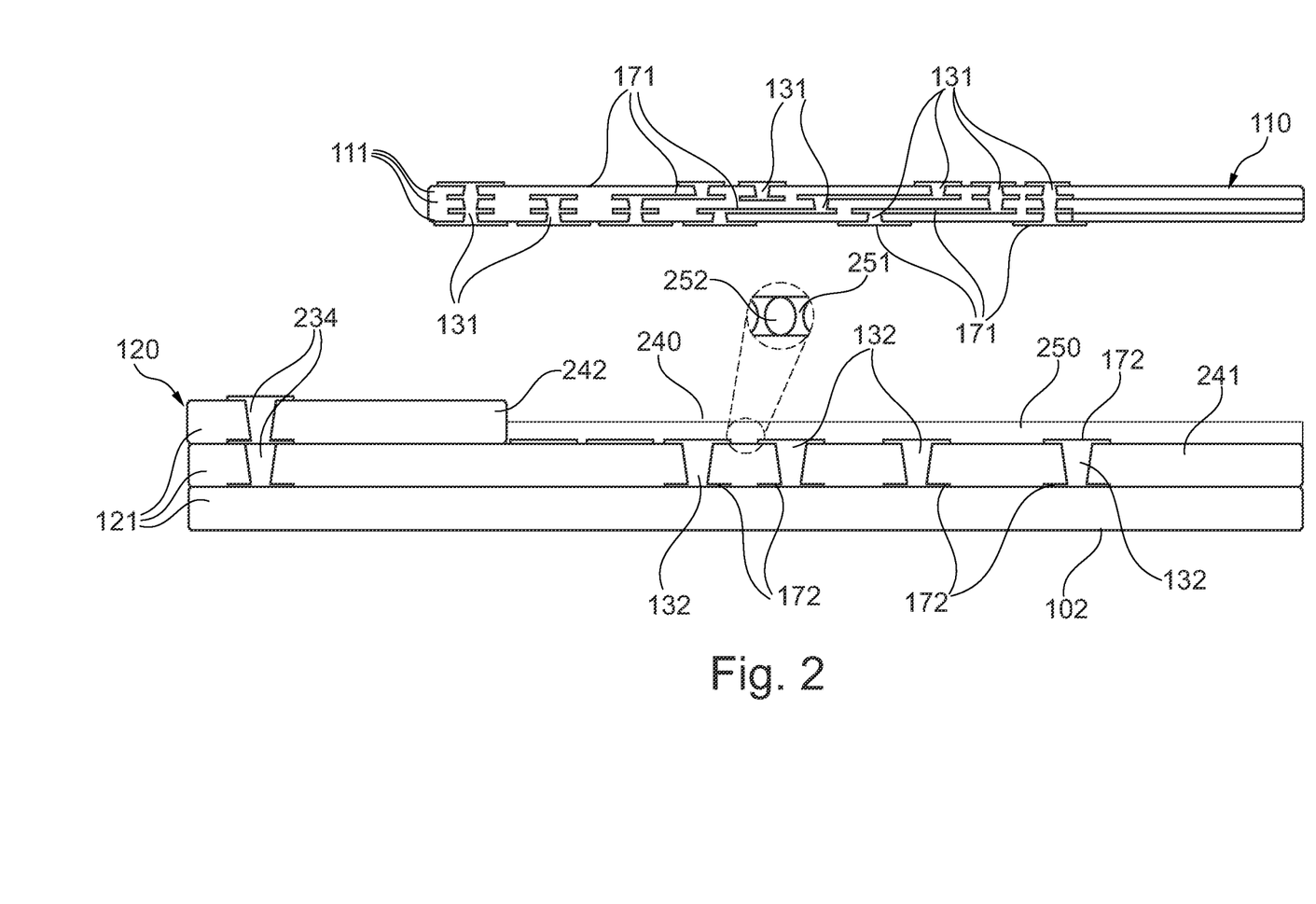
FIG. 2 shows a cross-sectional view of a pre-processed low density layer structure and a high density layer structure before accommodating the high density layer structure in a cavity of the low density layer structure, as obtained during a method of manufacturing a component carrier according to an exemplary embodiment of the invention.

In FIG. 2, a preprocessed, recessed low density layer structure 120 and a high density layer structure 110 to be subsequently located in a cavity 240 of the low density layer structure 120 are shown. The low density layer structure 120 comprises three low density layer sub-structures or elements 121. Two of the three low density layer sub-structures 121 are formed as continuous layers. One of the two low density layer sub-structures 121 has multiple vias 132. The vias 132 are preferably formed by laser drilling and filling the drilled hole with a conductive material as for example copper. Different vias 132 are provided at separate locations. The vias 132 may each provide a contact to the surface of the cavity 240 and may therefore be subsequently electrically connected to corresponding electrically conductive structures of the high density layer structure 110.

An opening is formed in the uppermost low density layer sub-structure 121. Together with the low density layer sub-structure 121 in the middle between the other two low density layer sub-structures 121, the cavity 240 is formed in the low density layer structure 120. A vertical wall surface 242 of the cavity 240 is defined by a side-wall of the uppermost low density layer sub-structure 121 and a horizontal bottom surface 241 of the cavity 420 is defined by the low density layer sub-structure 121 in the middle between the other two low density layer sub-structures 121. The vias 132 are formed to provide a connection from the inside of the low density layer structure 120 of the component carrier 100 to the bottom surface 241 of the cavity 240. A connection between the three low density layer sub-structures or elements 121 is formed by further vias 234.

The low density layer structure 120 further comprises patterned layer-type conductive paths 172 providing a horizontal connection between different terminals of the low density layer sub-structures 121.

Furthermore, the high density layer structure 110 comprising three high density layer sub-structures or elements 111 is provided separately and still spaced apart from the low density layer structure 120. Vias 131 and conductive paths 171 are formed in the high density layer structure 110. The conductive paths 171 provide a horizontal connection between different terminals of the high density layer sub-structures 111. The vias 131 are formed in the high density layer structure 110 to provide a vertical connection between the three different high density layer sub-structures 111. Additionally, the vias 131 are located in the high density layer structure 110 such that a connection between a respective one of the vias 131 and a respective one of the vias 132 being located in the low density layer structure 120 is providable upon connecting the high density layer structure 110 to the low density layer structure 120 in a subsequent procedure. Thus, an electric coupling between the high density layer structure 110 and the low density layer structure 120 is providable.

As may also be seen in FIG. 2, after providing the cavity 240 in the uppermost low density layer sub-structure 121, a layer of an adhesive structure 250 is provided in the cavity 240. The adhesive structure 250 covers the horizontal bottom surface 241 of the cavity 240 and a part of the vertical wall surface 242 of the cavity 240. The adhesive structure 250 is electrically conductive, for instance may be an Anisotropic Conductive Film (ACF). The Anisotropic Conductive Film 250 comprises an adhesive material 251 which is smooth and flexible and capable of accomplishing adhesion, and electrically conductive particles 252, for example copper particles, which are embedded within the adhesive material 251 to form a conductive connection between the high density layer structure 110 and the low density layer structure 120 after their assembly. By providing the Anisotropic Conductive Film 250, a reliable connection is providable even if a high number of terminals are provided close to each other. Additionally, a connection between pads of different sizes is providable by the Anisotropic Conductive Film 250.

Figure 3:
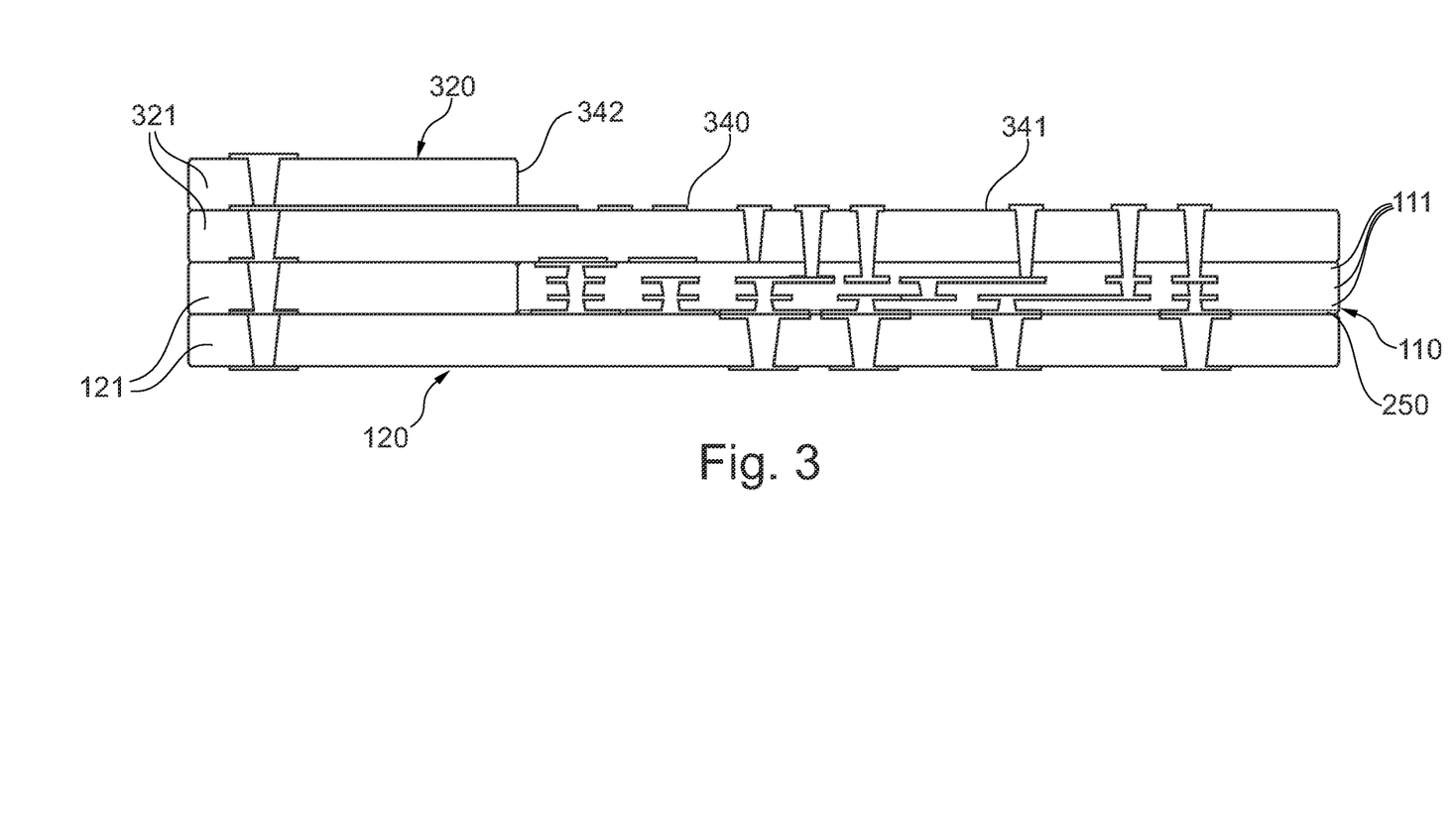
FIG. 3 shows a cross-section view of a plurality of low density layer structures and a high density layer structure, being alternatingly vertically stacked, as obtained during a method of manufacturing a component carrier according to an exemplary embodiment of the invention.

In FIG. 3, a plurality of low density layer structures 120, 320 and a high density layer structure 110, being alternatingly vertically stacked, are shown. The high density layer structure 110 comprises three high density layer sub-structures or elements 111 which are together fixed in the cavity 240 (depicted in FIG. 2, not shown in FIG. 3) of the low density layer structure 120. Additionally, the further low density layer structure 320 comprises two further low density layer sub-structures or elements 321, and is vertically stacked above the low density layer structure 120 and the high density layer structure 110. Thus, the high density layer structure 110 is sandwiched in-between the low density layer structure 120 and the further low density layer structure 320. The two further low density layer sub-structures 321 are for example fixed together by an adhesive structure which may for example be an Anisotropic Conductive Film similar to the Anisotropic Conductive Film 250 being provided in the cavity 240 (depicted in detail in FIG. 2). The two further low density layer sub-structures 321 form a further cavity 340. A first of the two further low density layer sub-structures 321 forms a further horizontal bottom surface 341 of the cavity 340, and side-walls of an opening in a second of the two low density layer sub-structures 321 forms a further vertical wall surface 342 of the further cavity 340. A further adhesive structure (not depicted in FIG. 3) is provided in the further cavity 340 for ensuring a possible fixation and connection to a further high density layer structure or an electronic component (see FIG. 6) which may be positioned in the further cavity 340.

Figure 4:
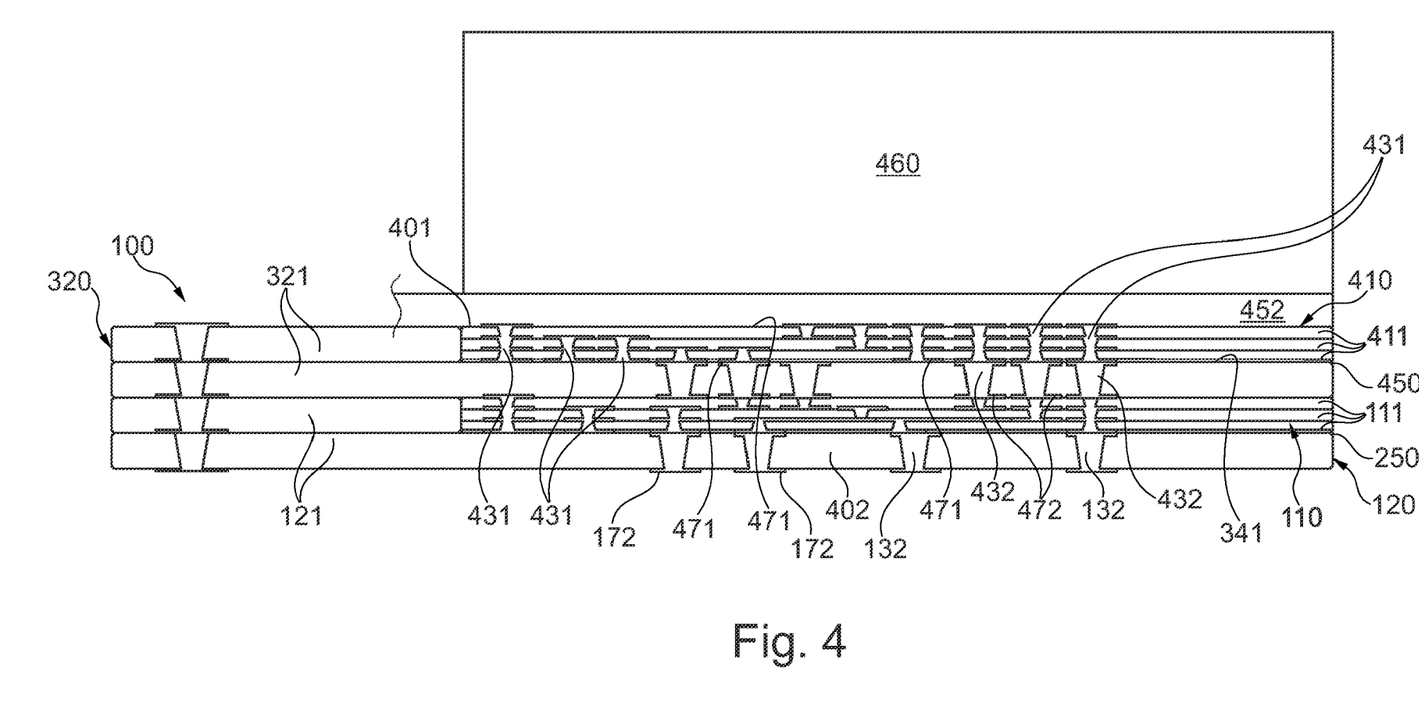
FIG. 4 shows a cross-sectional view of a component carrier with an electronic component mounted thereon according to an exemplary embodiment of the invention.

FIG. 4 shows a cross-sectional view of a component carrier 100 with an electronic component 460 (such as a semiconductor chip encapsulated in a mold compound or the like) mounted thereon according to an exemplary embodiment. In addition to the structure shown in FIG. 3, the component carrier 100 comprises a further high density layer structure 410 comprising three further high density layer sub-structures or elements 411, fixed in the further cavity 340 of the further low density layer structure 320 by an Adhesive Conductive Film 450 being provided on the further horizontal bottom surface 341 of the further cavity 340. The further high density layer structure 410 may be similar or identical to the high density layer structure 110. However, the further high density layer structure 410 has a higher density of electrically conductive structures as for example vias 431 and/or conductive paths 471 than vias 132, 432 and conductive paths 172, 472 of the low density layer structure 120 and the further low density layer structure 320, respectively. The component carrier 100 has a first main surface 401 for mounting the electronic component 460, and a second main surface 402 opposing the first main surface 401. The second main surface 402 is defined by the low density layer structure 120. The first main surface 401 is defined by a part of the further high density layer structure 410 and by a part of the further low density layer structure 320. The electronic component 460 is fixed to the first main surface 401 by an appropriate schematically shown connection structure 452, such as one or more solder balls (not shown).

Figure 5:
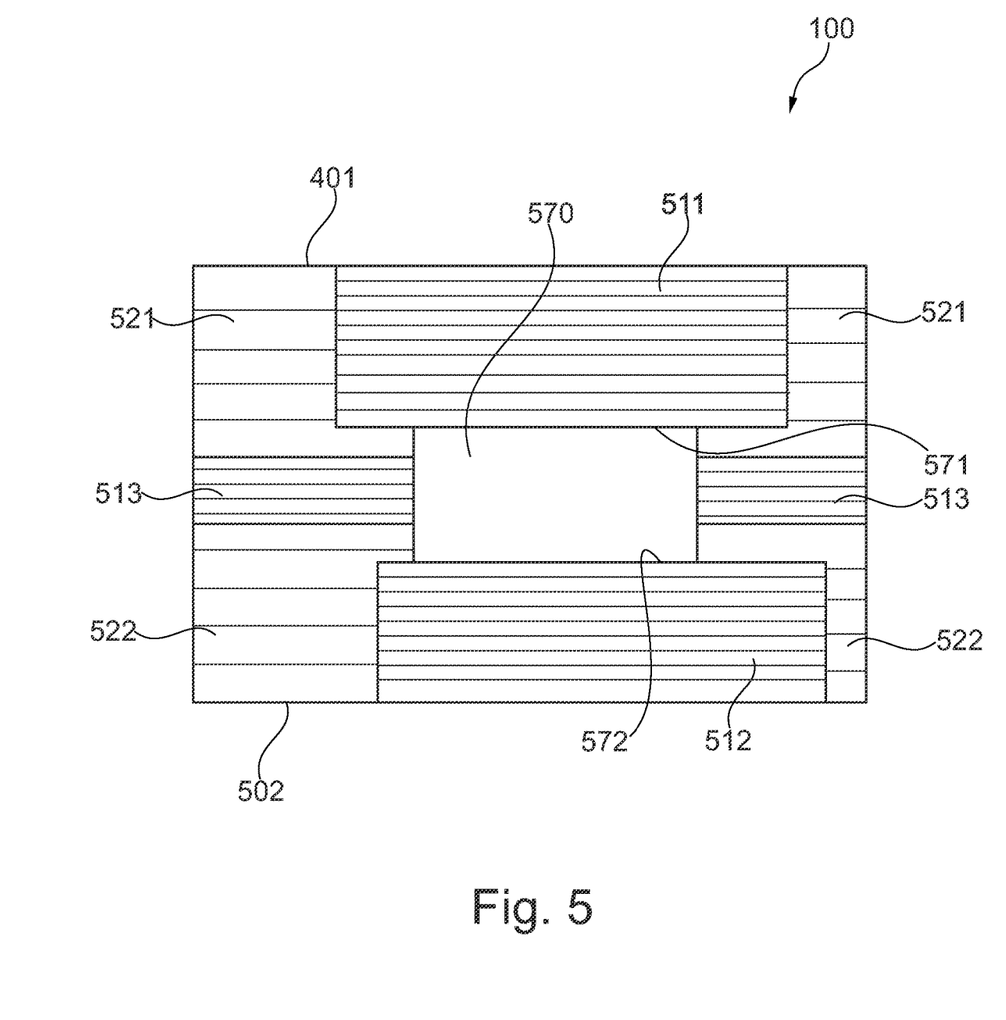
FIG. 5 shows a schematical view of a component carrier comprising an embedded electronic component according to an exemplary embodiment of the invention.

In FIG. 5, a component carrier 100 comprising an embedded electronic component 570 according to an exemplary embodiment is shown. The embedded electronic component 570 is arranged in-between a first high density layer structure 511 and a second high density layer structure 512. The first high density layer structure 511 is provided in a cavity of a first low density layer structure 521. The second high density layer structure 512 is provided in a cavity of a second low density layer structure 522. The cavity in the first low density layer structure 521 and the cavity in the second low density layer structure 522, respectively, each comprises a stepped through-hole having an opening through which the embedded electronic component 570 is in direct contact with the first high density layer structure 511 and the second high density layer structure 512, respectively. A first main surface 571 of the embedded electronic component 570 is in contact with the first high density layer structure 511. A second main surface 572 of the embedded electronic component 570 is in contact with the second high density layer structure 512. Thus, a high fan-out of signals of the embedded electronic component 570 via the first high density layer structure 511 and via the second high density layer structure 512, respectively, in the direction of the first main surface 401 of the component carrier 100 and at the same time in the direction of the second main surface 502 of the component carrier 100 is providable.

In FIG. 5, high density regions are indicated schematically by very closely located features, whereas low density regions are indicated schematically by less closely located features.

As it may also be seen in FIG. 5, the second main surface 502 of the component carrier 100 also comprises a part of the second high density layer structure 512, if suitable for the application. Furthermore, a third high density layer structure 513 being provided in-between the first low density layer structure 521 and the second low density layer structure 522 has an opening whose dimension fits a narrower dimension of the stepped through-hole of the first low density layer structure 521 and the second low density layer structure 522, respectively. Thus, a vertical side-wall of the stepped through-hole of the first low density layer structure 521 merges a vertical side-wall of the opening of the third high density layer structure 513. The first high density layer structure 511, the first low density layer structure 521, the third high density layer structure 513, the second low density layer structure 522 and the second high density layer structure 512 are alternatingly vertically stacked. In particular, in a boundary area on a right boundary and a left boundary, respectively, of the embedded electronic component 570, the two low density layer structures 521, 522 and the three high density layer structures 511, 512, 513 are alternatingly vertically stacked, in particular in the order from top to bottom of the first high density layer structure 511, the first low density layer structure 521, the third high density layer structure 513, the second low density layer structure 522 and the second high density layer structure 512.

Figure 6:
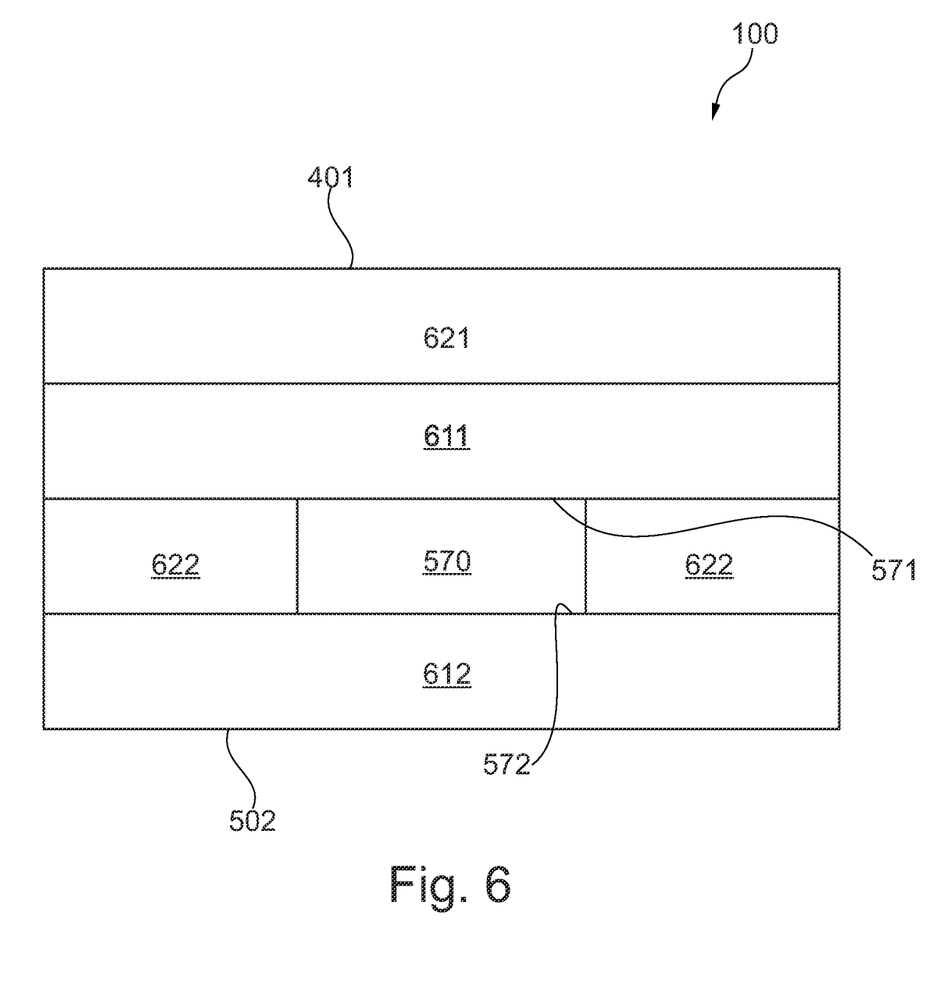
FIG. 6 shows a schematical view of a component carrier comprising an embedded electronic component according to an exemplary embodiment of the invention.

In FIG. 6, a component carrier 100 comprising an embedded electronic component 570 according to an exemplary embodiment is shown. The embedded electronic component 570 is arranged vertically in-between a first high density layer structure 611 and a second high density layer structure 612. The first high density layer structure 611 is provided vertically in-between the embedded electronic component 570 and a first low density layer structure 621. A first main surface 571 of the embedded electronic component 570 contacts the first high density layer structure 611. The second high density layer structure 612 contacts a second main surface 572 of the embedded electronic component 570 and one main surface of a second low density layer structure 622 having a central recess or opening in which the electronic component 570 is embedded. The second main surface 572 of the embedded electronic component 570 is located opposite of the first main surface 571. Thus, a high fan-out of signals of the embedded electronic component 570 via the first high density layer structure 611 in an upward direction and via the first low density layer structure 621 in the direction towards a first main surface 401 of the component carrier 100 is providable. At the same time a high fan-out of signals of the embedded electronic component 570 in a downward direction via the second high density layer structure 612 towards the second main surface 502 of the component carrier 100 is providable. As may be seen in FIG. 6 as well, the embedded electronic component 570 is embedded in a cavity being designed as a through hole in the second low density layer structure 622.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a plurality of low density layer structures;
   a plurality of high density layer structures having a higher density of electrically conductive structures than the plurality of low density layer structures,
   wherein a criterion indicative of the density of electrically conductive structures is a number of electrically conductive components per unit of volume of the respective low density layer structure or high density layer structure;
   wherein the low density layer structures and the high density layer structures are alternatingly vertically stacked so that at least one low density layer structure is vertically arranged in-between two high density layer structures;
   wherein a vertical electrical connection between the low density layer structures and the high density layer structures is provided;
   wherein the high density layer structures are configured to enable a sequential fan-out of a component mounted on the component carrier or embedded in the component carrier.

2. The component carrier according to claim 1, wherein a criterion indicative of the density of electrically conductive structures is selected from a group consisting of
   a complexity of constitution of the respective low density layer structure or high density layer structure;
   a number of stacked layer sub-structures of which the respective low density layer structure or high density layer structure is constituted;
   a thickness of a respective of stacked layer sub-structures of which the respective plurality of low density layer structures or plurality of high density layer structures is constituted;
   one or more materials of stacked layer sub-structures of which the respective plurality of low density layer structures or plurality of high density layer structures is constituted;
   a high frequency suitability or a lacking high frequency suitability of the respective low density layer structure or high density layer structure;
   an integration density defined as a number of sub-structures per volume of the respective low density layer structure or high density layer structure.

3. The component carrier according to claim 1,
   wherein at least one of the plurality of low density layer structures comprises a cavity; and
   wherein at least one of the plurality of high density layer structures is arranged in the cavity.

4. The component carrier according to claim 1,
   wherein at least one of the plurality of low density layer structures comprises a cavity;
   wherein at least two of the plurality of high density layer structures are arranged in the cavity; and
   wherein at least one of the plurality of low density layer structures is vertically interposed between the at least two of the plurality of high density layer structures arranged in the cavity.

5. The component carrier according to claim 3, wherein an adhesive structure is provided on a surface of the cavity.

6. The component carrier according to claim 1, wherein an adhesive structure is provided in-between at least one of the plurality of low density layer structures and at least one of the plurality of high density layer structures.

7. The component carrier according to claim 5, wherein the adhesive structure comprises an electrically conductive adhesive.

8. The component carrier according to claim 5, wherein the adhesive structure comprises at least one of the group consisting of an Anisotropic Conductive Film and an Anisotropic Conductive Paste.

9. The component carrier according to claim 1, comprising at least one of the following features:
at least one of the group consisting of the plurality of high density layer structures and the plurality of low density layer structures comprises or consists of a stack of at least one electrically insulating layer sub-structure and at least one electrically conductive layer sub-structure;
wherein the at least one electrically insulating layer sub-structure comprises at least one of the group consisting of resin, Bismaleimide-Triazine resin, cyanate ester, glass, glass fibers prepreg material, polyamide, liquid crystal polymer, epoxy-based Build-Up film, FR4 material, FR5 material, a ceramic, and a metal oxide;
wherein the at least one electrically conductive layer sub-structure comprises at least one of the group consisting of copper, aluminum, and nickel;
wherein the component carrier is shaped as a plate;
the component carrier is configured as one of the group consisting of a printed circuit board, and a substrate;
the component carrier is a laminate-type component carrier.

10. The component carrier according to claim 1, further comprising:
a first main surface configured for mounting an electronic component; and
a second main surface opposing the first main surface;
wherein the first main surface is part of one of the plurality of high density layer structures; and
wherein the second main surface is part of one of the plurality of low density layer structures.

11. The component carrier according to claim 1, further comprising:
an electronic component embedded in an interior of the component carrier,
wherein the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip.

12. The component carrier according to claim 1, wherein the plurality of high density layer structures and the plurality of low density layer structures are configured so that electrically conductive sub-structures comprising high density vias of different high-density structures are electrically coupled to one another via electrically conductive sub-structures comprising low density vias of at least one of the low density layer structures.

13. The component carrier according to claim 1, comprising at least one of the following features:
at least one of the high density layer structures is configured as a substrate and at least one of the low density layer structures is configured as a printed circuit board such that the substrate is built in the printed circuit board;
the plurality of high density layer structures are electrically connected with one another directly via the plurality of low density layer structures.

14. A method of manufacturing a component carrier, the method comprising:
providing a plurality of low density layer structures;
providing a plurality of high density layer structures having a higher density of electrically conductive structures than the plurality of low density layer structures,
wherein a criterion indicative of the density of electrically conductive structures is a number of electrically conductive components per unit of volume of the respective low density layer structure or high density layer structure;
alternatingly vertically stacking the low density layer structures and the high density layer structures so that at least one low density layer structure is vertically arranged in-between two high density layer structures; and
providing a vertical electrical connection between the low density layer structures and the high density layer structures;
wherein the high density layer structures are configured to enable a sequential fan-out of a component mounted on the component carrier or embedded in the component carrier.

15. The method according to claim 14, wherein at least one of the plurality of low density layer structures is a readily manufactured module being readily manufactured prior to the stacking.

16. The method according to claim 14, wherein at least one of the plurality of high density layer structures is a readily manufactured module being readily manufactured prior to the stacking.

17. The method according to claim 14, the method further comprising:
forming a cavity in at least one of the plurality of low density layer structures;
arranging at least one of the plurality of high density layer structures in the cavity.

18. The method according to claim 14, further comprising:
forming a cavity in at least one of the plurality of low density layer structures;
arranging at least two of the plurality of high density layer structures in the cavity; and
vertically interposing at least one of the plurality of low density layer structures between the at least two of the plurality of high density layer structures arranged in the cavity.

19. The method according to claim 17, further comprising, after forming the cavity:
providing an adhesive structure on a surface of the cavity.

20. The method according to claim 18, further comprising, prior to vertically interposing:
providing an adhesive structure in-between at least one of the plurality of low density layer structures and at least one of the plurality of high density layer structures.

* * * * *